(12) United States Patent
Nakahara

(10) Patent No.: US 7,417,263 B2
(45) Date of Patent: Aug. 26, 2008

(54) TRANSPARENT ELECTRODE

(75) Inventor: Ken Nakahara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 8 days.

(21) Appl. No.: 10/748,734

(22) Filed: Dec. 30, 2003

(65) Prior Publication Data
US 2004/0166379 A1    Aug. 26, 2004

(30) Foreign Application Priority Data
Feb. 25, 2003    (JP)    ............... 2003-048065

(51) Int. Cl.
*H01L 33/00* (2006.01)
*H01L 23/29* (2006.01)

(52) U.S. Cl. .................. 257/99; 257/100; 257/102; 257/103

(58) Field of Classification Search .......... 257/79–103; 372/43–50; 349/42–53
See application file for complete search history.

(56) References Cited

U.S. PATENT DOCUMENTS

| | | | |
|---|---|---|---|
| 4,888,202 A * | 12/1989 | Murakami et al. | ......... 117/105 |
| 5,625,202 A | 4/1997 | Chai | |
| 5,804,834 A | 9/1998 | Shimoyama et al. | |
| 6,057,561 A * | 5/2000 | Kawasaki et al. | ............. 257/94 |
| 6,084,899 A * | 7/2000 | Shakuda | ................ 372/45.01 |
| 6,320,207 B1 | 11/2001 | Furukawa et al. | |
| 6,416,888 B1 | 7/2002 | Kawamura et al. | |
| 6,423,983 B1 * | 7/2002 | Narayan et al. | ............... 257/96 |
| 6,541,797 B1 | 4/2003 | Udagawa | |
| 6,674,098 B1 * | 1/2004 | Niki et al. | ................... 257/102 |
| 6,787,435 B2 * | 9/2004 | Gibb et al. | ................... 438/507 |
| 6,806,503 B2 | 10/2004 | Hosono et al. | |

2001/0028062 A1 * 10/2001 Uemura et al. ................. 257/79

(Continued)

FOREIGN PATENT DOCUMENTS

JP    11-070610    3/1999

(Continued)

OTHER PUBLICATIONS

Wada et al, "Thin Film Materials Technology—Sputtering of Compound Materials", publisher: William Andrew Publishing / Noyes (2004), p. 306 (Table 5.28).*

(Continued)

*Primary Examiner*—Johannes P Mondt
(74) *Attorney, Agent, or Firm*—Hogan & Hartson LLP

(57) ABSTRACT

In order to emit a light from an electrode side, in semiconductor light emitting devices such as LED and the like, and liquid crystal, the electrode is formed of a transparent material so as to transmit a light through the transparent electrode and exit the light. A ZnO, which constitutes a material for the transparent electrode, is subject to erosion by acid and alkali, thus, as the case may cause loss of a reliability of the electrode under the influence of ion-containing moisture. In order to solve such a problem, this invention has as its aim a transparent electrode film provided with stability capable of preventing any degradation under the influence of any ion-containing moisture, while being kept acid-proof and alkali-proof. In order to accomplish the above-mentioned aim, this invention provides a transparent electrode made up of a ZnO as its main material, wherein its surface is covered with a Mg-doped ZnO film.

1 Claim, 4 Drawing Sheets

U.S. PATENT DOCUMENTS

| | | | |
|---|---|---|---|
| 2002/0030196 A1 | 3/2002 | Iwata et al. | |
| 2002/0105279 A1* | 8/2002 | Kimura | 315/169.3 |
| 2002/0126719 A1* | 9/2002 | Kadota | 372/45 |
| 2002/0127853 A1* | 9/2002 | Hubacek et al. | 438/689 |
| 2003/0209723 A1 | 11/2003 | Sakai | |
| 2004/0051109 A1 | 3/2004 | Ishizaki et al. | |
| 2004/0079947 A1* | 4/2004 | Lan et al. | 257/79 |
| 2004/0104392 A1 | 6/2004 | Ishizaki | |
| 2004/0112278 A1* | 6/2004 | Yoshida et al. | 117/30 |
| 2004/0235212 A1 | 11/2004 | Ishizaki | |
| 2005/0224825 A1* | 10/2005 | Ishizaki | 257/94 |

FOREIGN PATENT DOCUMENTS

| | | |
|---|---|---|
| JP | 2000-353820 | 12/2000 |
| JP | 2001-210867 | 8/2001 |
| JP | 2002-076356 | 3/2002 |
| JP | 2002-011059 | 4/2002 |
| JP | 2002-164570 | 6/2002 |
| JP | 2002-170993 | 6/2002 |
| JP | 2002-222991 | 8/2002 |
| JP | 2003037268 A | 2/2003 |
| WO | WO 01/08229 A1 * | 8/2002 |
| WO | WO-02-070793 A1 * | 9/2002 |
| WO | WO-02/89223 * | 11/2002 |

OTHER PUBLICATIONS

S. M. Sze, "Modern Semiconductor Device Physics", John Wiley & Sons, Inc., New York ; p. 537 (Appendix F)(ISBN: 0-471-15237-4 (1998)).*

Merriam-Webster's Collegiate Dictionary, tenth Edition, p. 811; Merriam-Webster, Incorporated, Springfield, MA (USA) (1999).*

Japanese language office action and its English translation for corresponding Japanese application No. 2003-048065 list the reference above.

* cited by examiner

TRANSPARENT ELECTRODE

BACKGROUND OF THE INVENTION

1. Field of the Invention

The present invention relates to a transparent electrode provided with stability capable of preventing any degradation due to ion-containing moistures, while being kept acid-proof and alkali-proof.

2. Description of the Related Art

Conventionally, in semiconductor light emitting devices such as LED, and liquid crystal, the electrode is formed, for emitting a light from an electrode side, of a transparent material to allow light to transmit through the transparent electrode and exit it (for example, refer to related art document 1 below). ZnO, which is material as the transparent electrode, is subject to erosion by acid and alkali, and thus may cause loss of a reliability of the electrode under the influence of ion-containing moistures. Moreover, when employed as a white light source utilizing an emission of LED, a semiconductor light emitting device is covered with an epoxy resin mixed with a fluorescent material.

In FIG. 4 there is shown an arrangement of a light emitting device module as a conventional white light source. In FIG. 4, a reference numeral 51 refers to a semiconductor light emitting device, 52 refers to an epoxy resin, 53 refers to a module substrate and 54 refers to moisture. As shown in FIG. 4, the entire semiconductor light emitting devices 51, which is mounted on the module substrate 53 of the light emitting device module, is covered with the epoxy resin 52. The fluorescent material mixed with the epoxy resin 52 is excited by emission from the semiconductor light emitting devices 51 and thus emits white light. However, the moisture is liable to penetrate the epoxy resin 52 so that when any moisture contained inside the epoxy resin 52 or the moisture 54 from the outside penetrates, or in particular, the moisture 54 contains ions, it exhibits acidity or alkalinity, thus, as the case may be, resulting in an erosion of a ZnO transparent electrode employed for the semiconductor light emitting device. It is probably assumed that a high ionization tendency of Zn causes said phenomenon.

[Related Art Document 1]

Japanese patent laid-open publication 11-70610, (FIG. 3, page 3-4)

SUMMARY OF THE INVENTION

In order to solve such a problem, the object of the invention is to provide a transparent electrode film provided with stability capable of preventing any degradation due to penetration of ion-containing moistures.

The inventor has discovered that doping ZnO, which is employed as a transparent electrode of a light emitting device, with Mg leads to a greatly improved acid resistance. In FIG. 1, an experimental result of a measured acid resistance of Mg-doped ZnO transparent electrodes with a doped-Mg amount as parameter is shown. In FIG. 1, a horizontal axis shows etching time, a vertical axis shows an etching depth, and a parameter of Mg shows weight % of the Mg to be doped to ZnO. In this experiment, the etching depth was measured by dipping the ZnO transparent electrode into an acid liquid with a volume ratio of a 35% concentration hydrochloric acid to water of 1:100. FIG. 1 shows that the etching depth decreases to one fourth or less as compared with the non-Mg doped transparent electrode, when doping Mg of 12 mol % or more. This also indicates that the Mg-doped ZnO can prevent any degradation of reliability due to ion-containing moistures.

Then, in order to accomplish the object mentioned above, the invention provides a transparent electrode made up of ZnO as its main material, wherein its surface is covered with a Mg-doped ZnO film.

According to the invention, in the transparent electrode, an acid-resistance can be increased and any degradation of reliability due to ion-containing moistures can be prevented.

REFERENCE NUMERALS

Figure 1:
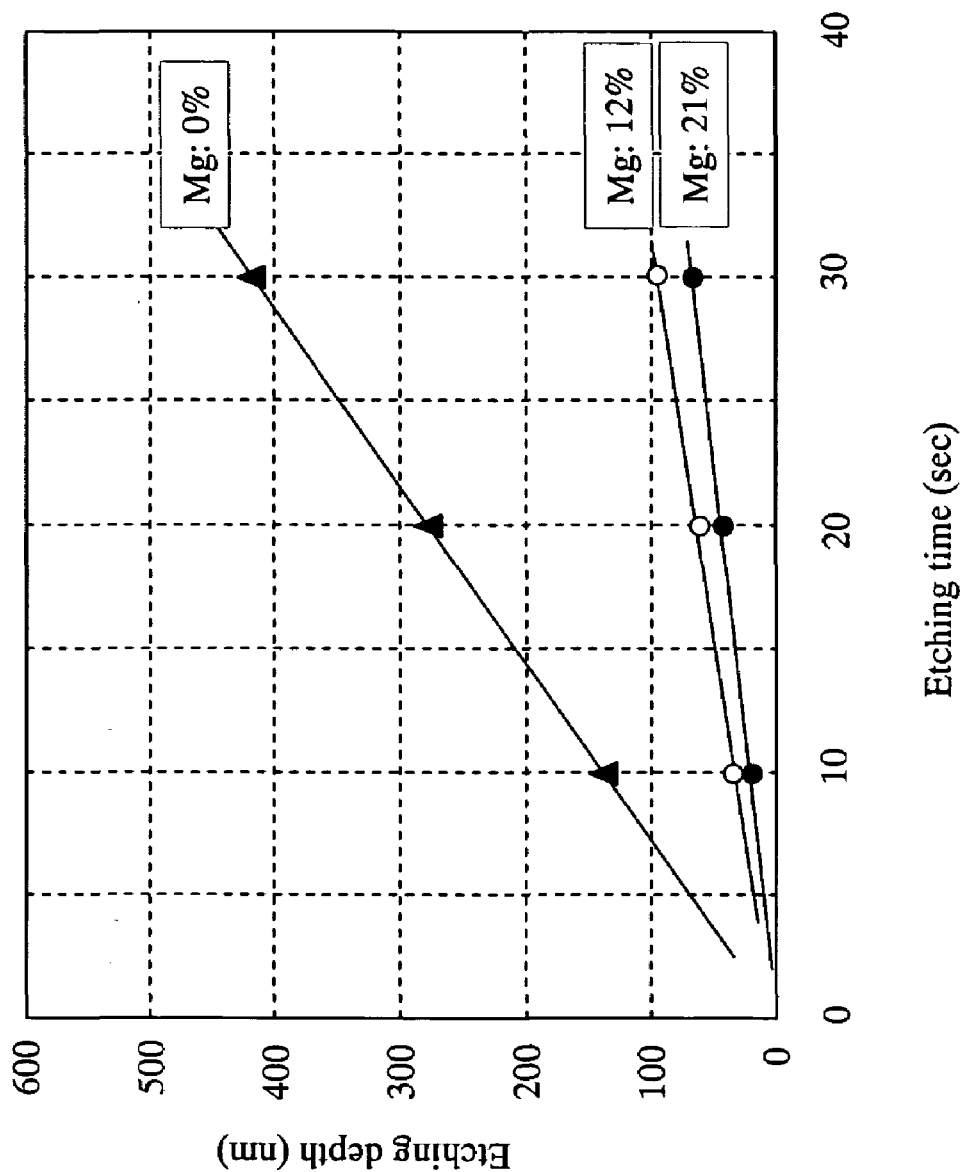
FIG. 1 is a graph illustrating measured acid resistance of Mg-doped ZnO on which the present invention is based.

11: Mg-doped ZnO film
12: ZnO transparent electrode
13: metal pattern
14: metal electrode
15: Sapphire substrate
20: GaN system semiconductor layer
21: p type GaN system semiconductor layer
22: emission layer
23: n type GaN system semiconductor layer

DETAILED DESCRIPTION OF THE INVENTION

Hereafter embodiments of the present invention will be described with reference to accompanying drawings.

DESCRIPTION OF THE PREFERRED EMBODIMENTS

Embodiment 1

Figure 2:
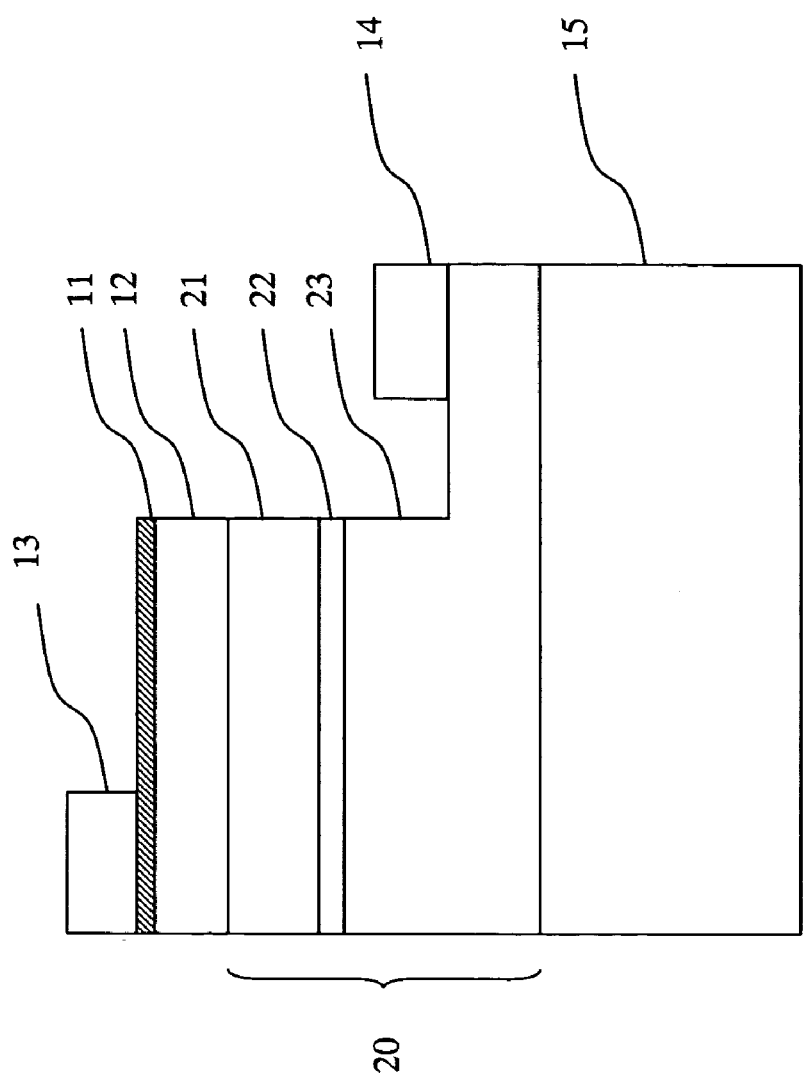
FIG. 2 is a view showing an arrangement of an embodiment in which the invention is applied to a GaN system semiconductor light emitting device, and explaining a ZnO transparent electrode wherein a top surface is covered with a Mg-doped ZnO film.

A first embodiment of the invention is shown in FIG. 2. FIG. 2 is an embodiment of a GaN system semiconductor light emitting device to which the invention is applied. In FIG. 2, 11 is a Mg-doped ZnO film, 12 is a ZnO transparent electrode, 13 is a metal pattern, 14 is a metal electrode, 15 is a sapphire substrate, 21 is a p type GaN system semiconductor layer, 22 is an emission layer, 23 is an n type GaN system semiconductor layer, and 20 is a GaN system semiconductor layer which includes the p type GaN system semiconductor layer 21, the emission layer 22, and the n type GaN system semiconductor layer 23. In the present invention, the GaN system semiconductor layer refers to a semiconductor layer, which includes at least one layer of $In_pGa_qAl_rN$ ($p+q+r=1$, $p \geq 0$, $q \geq 0$, $r \geq 0$).

In such a GaN system semiconductor light emitting device, first of all, the n type GaN system semiconductor layer 23 is formed on the top surface of the sapphire substrate 15 with MOCVD (metal organic chemical vapor deposition) method and the like. It is suitable that the n type GaN system semiconductor layer 23 is contained of an n type GaN and a GaN buffer layer. The n type GaN system semiconductor layer 23 may be formed with ELO (Epitaxial Lateral Overgrowth). The emission layer 22 is formed on the top surface of the n type GaN system semiconductor layer 23. The emission layer 22 consists of $In_xGa_{1-x}N$ ($0 \leq x<1$) or/and $Al_yGa_{1-y}N$ ($0 \leq y<1$). Moreover, the emission layer 22 may be in the form of a multi-quantum well structure of $In_xGa_{1-x}N/GaN$ ($0 \leq x<1$) by adjusting the ratio of In and Ga, or a multi-quantum well structure of $Al_yGa_{1-y}N/GaN$ ($0 \leq y<1$) by adjusting the ratio of aluminum and Ga. Furthermore, a multi-quantum well structure of $In_pGa_qAl_rN/GaN$ ($p+q+r=1, p \geq 0, q \geq 0, r \geq 0$) may as well be realized by adjusting the ratio of In, Ga and aluminum. Moreover, a layer consisting of an n type $Al_yGa_{1-y}N$ ($0 \leq y<1$) may be formed on the n type GaN system semiconductor layer 23 side of the emission layer 22, or a layer consisting of $Al_yGa_{1-y}N$ ($0 \leq y<1$) may be formed on the p type GaN system semiconductor layer 21 side of the emission layer 22.

Next, the p type GaN system semiconductor layer 21 is formed on the top surface of the emission layer 22. After having formed the ZnO transparent electrode 12 on the top surface of the p type GaN system semiconductor 21, a part of the ZnO transparent electrode 12, the p type GaN system semiconductor layer 21, the emission layer 22, and the n type GaN system semiconductor layer 23 is removed by etching, respectively. The n type GaN system semiconductor layer 23 is etched down to the midway of the layer thereof. Next, the Mg-doped ZnO film 11 is formed, and then the metal electrode 14 is formed on the top surface of the exposed n type GaN system semiconductor layer 23, and the metal pattern 13 is formed on the top surface of the Mg-doped ZnO film 11 with an evaporation method or a sputtering method.

Or after having formed the p type GaN system semiconductor layer 21 on the top surface of the emission layer 22, a part of the p type GaN system semiconductor layer 21, the emission layer 22, and the n type GaN system semiconductor layer 23 is removed by etching, respectively. The n type GaN system semiconductor layer 23 is etched down to the midway of the layer thereof. Next, the ZnO transparent electrode 12 is formed on the top surface of the p type GaN system semiconductor layer 21, and furthermore, on the top thereof, the Mg-doped ZnO film 11 is formed. The metal electrode 14 is formed on the top surface of the exposed n type GaN system semiconductor layer 23, while the metal pattern 13 is formed on the top surface of the Mg-doped ZnO film 11 with the evaporation method or the sputtering method.

The above-mentioned Mg-doped ZnO film 11 is formed with a sputtering method by using a target of a baked compound of mixed MgO and ZnO powders, an ion plating method and the like. Moreover, an evaporation method similar to a molecular beam epitaxial method, which provides metal Mg and metal Zn having been heated by a heater as a molecular beam, and provides oxygen using an RF radical cell, may also provide the same.

Moreover, as for the material, which constitutes the metal pattern 13, either of Al, Ti, Cr, Ni, Cu, Mo, Pd, W, Pt, or Au, or an alloy of these metals is as well available. The metal pattern includes a metal pad for bonding.

If the ZnO transparent electrode is covered with the Mg-doped ZnO film as described according to the embodiment, the Mg-doped ZnO film and the ZnO transparent electrode can be prevented from being eroded by moisture. Because Mg-doped ZnO has the same light transmittance and conductivity as ZnO, light emitted from a portion of the GaN system semiconductor layer transmits through the Mg-doped ZnO film, and then the conductivity between the metal pattern 13 formed on the Mg-doped ZnO film 11 and the ZnO transparent electrode 12 is also secured.

According to the embodiment, although the GaN system semiconductor layer 20 is formed on the top surface of the sapphire substrate 15, the GaN system semiconductor layer 20 may be formed on a conductive substrate in place of the sapphire substrate 15. Moreover, although the embodiment in which the transparent electrode is formed on the top surface of the GaN system semiconductor layer 20 has been described, the invention may be applicable not only to GaN system semiconductor layers but to semiconductor layers like those constituting semiconductor light emitting devices, and furthermore to devices which form a ZnO transparent electrode such as electronic devices including a liquid crystal.

Embodiment 2

Figure 3:
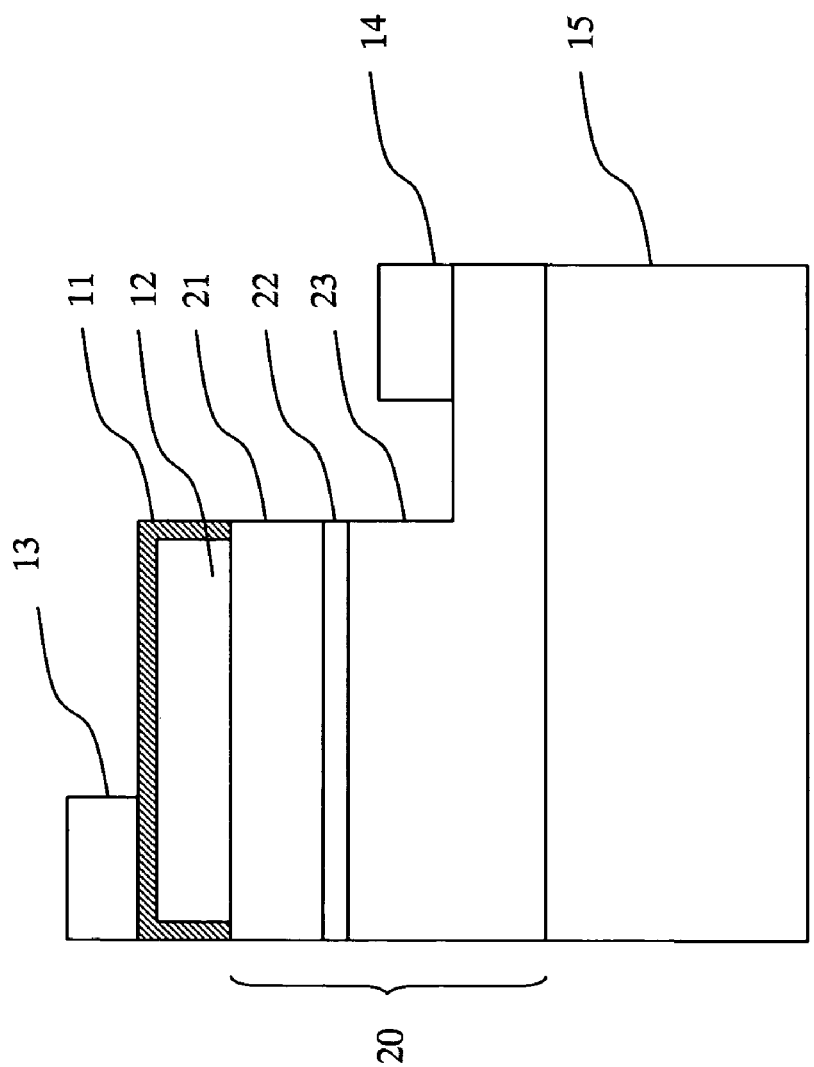
FIG. 3 is a view showing an arrangement of an embodiment in which the invention is applied to a GaN system semiconductor light emitting device, and explaining a ZnO transparent electrode wherein surfaces are covered with a Mg-doped ZnO film.
Figure 4:
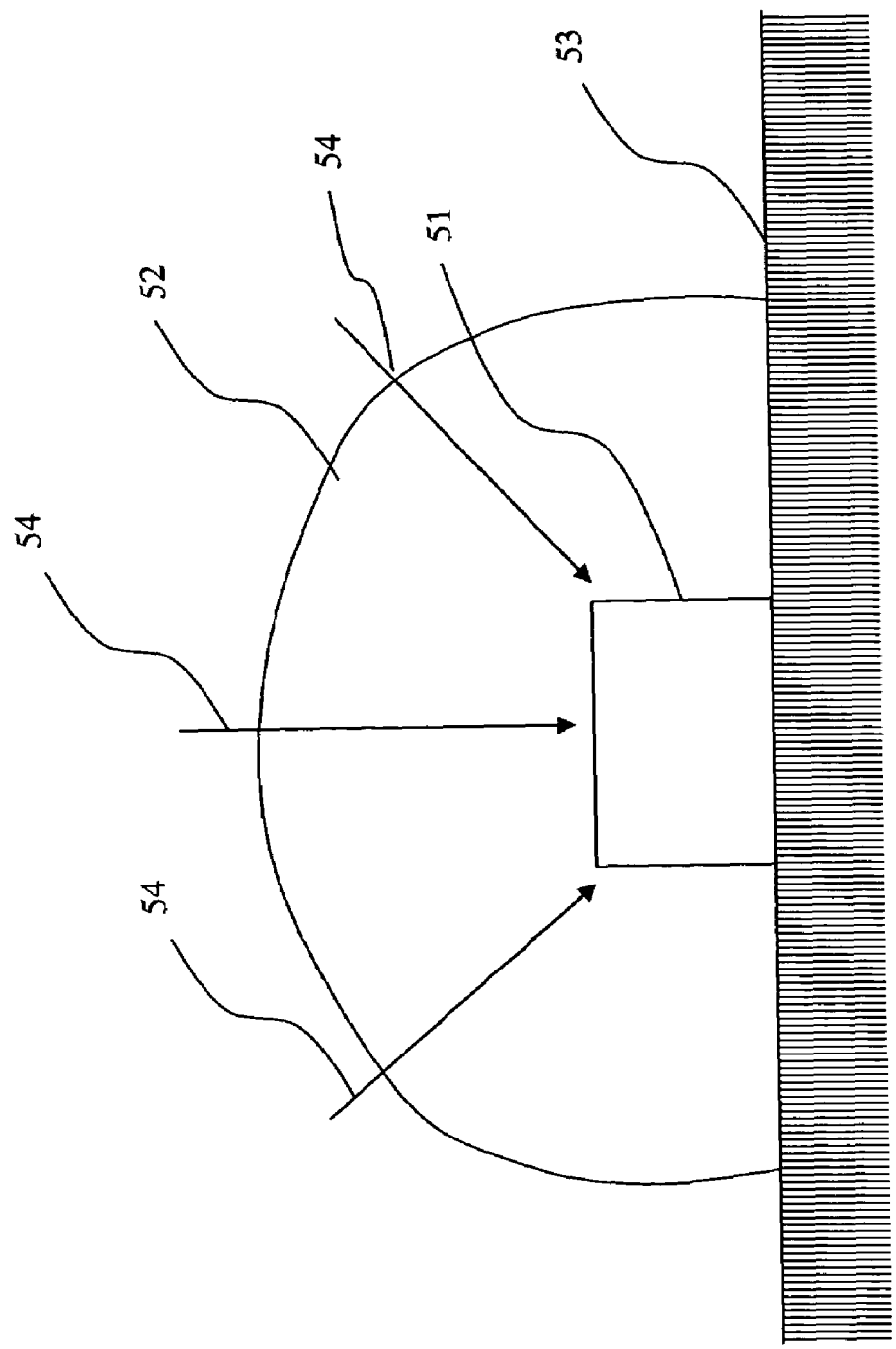
FIG. 4 is a view explaining an arrangement of a conventional light emitting device module employed as a white light source.

A second embodiment of the invention is shown in FIG. 3. FIG. 3 is an embodiment of a GaN system semiconductor light emitting device to which the invention is applied. In FIG. 3, 11 is a Mg doped ZnO film, 12 is a ZnO transparent electrode, 13 is a metal pattern, 14 is a metal electrode, 15 is a sapphire substrate, 21 is a p type GaN system semiconductor layer, 22 is a emission layer, 23 is an n type GaN system semiconductor layer, and 20 is a GaN system semiconductor layer which includes the p type GaN system semiconductor layer 21, the emission layer 22, and the n type GaN system semiconductor layer 23.

As for material, which constitutes the metal pattern 13, either of Al, Ti, Cr, Ni, Cu, Mo, Pd, W, Pt, or Au, or an alloy of these metals is as well available. The metal pattern includes a metal pad for bonding.

A point of a difference exists between the second embodiment and the first embodiment in that not only the top surface of the ZnO transparent electrode 12 but also the side surface thereof are covered with the Mg-doped ZnO film 11. Such a GaN system semiconductor light emitting device can be manufactured by the same process as the first embodiment.

As shown in FIG. 3, because not only the top surface of the ZnO transparent electrode 12 but the side surface thereof are covered with the Mg-doped ZnO film 11, the Mg-doped ZnO film 11 and the ZnO transparent electrode 12 can be prevented more effectively from being eroded by moisture, while ensuring light transmittance and conductivity. Moreover, when forming a metal pattern on the Mg-doped ZnO film 11 by etching, the Mg-doped ZnO film 11 and the ZnO transparent electrode 12 can be protected based upon further improvements of an acid resistance.

According to the embodiment, although the GaN system semiconductor layer 20 is formed on the top surface of the sapphire substrate 15, the GaN system semiconductor layer 20 may be formed on a conductive substrate in place of the sapphire substrate 15. Moreover, although the embodiment in which the transparent electrode is formed on the top surface of the GaN system semiconductor layer 20 has been described, the invention may be applicable not only to GaN system semiconductor layers but to semiconductor layers like those constituting semiconductor light emitting devices, and furthermore to devices which form a ZnO transparent electrode such as electronic devices including a liquid crystal.

[Effect of the Invention]

As described above, according to the invention, there can be achieved a transparent electrode, provided with stability capable of preventing any degradation due to penetration of ion-containing moistures, while being kept acid-proof and alkali-proof.

What is claimed is:

1. A light emitting device comprising:
a semiconductor layer formed on a substrate of a semiconductor device;
a ZnO transparent electrode formed on the semiconductor layer; and
an Mg-doped ZnO film disposed on a light emission side of an outer surface of the ZnO transparent electrode that is opposite to the substrate,
wherein the semiconductor layer comprises an n-type GaN system semiconductor layer formed on the substrate, an emission layer formed on the n-type GaN system semiconductor layer, and a p-type GaN system semiconductor layer formed on the emission layer.

* * * * *